United States Patent
Je et al.

(10) Patent No.: US 9,758,870 B2
(45) Date of Patent: Sep. 12, 2017

(54) SUBSTRATE TREATMENT APPARATUS, AND METHOD FOR CONTROLLING TEMPERATURE OF HEATER

(71) Applicant: EUGENE TECHNOLOGY CO., LTD., Gyeonggi-do (KR)

(72) Inventors: Sung-Tae Je, Gyeonggi-do (KR); Il-Kwang Yang, Gyeonggi-do (KR); Jae-Ho Lee, Gyeonggi-do (KR); Kyong-Hun Kim, Gyeonggi-do (KR); Myung-In Kim, Gyeonggi-do (KR); Yang-Sik Shin, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 181 days.

(21) Appl. No.: 14/646,079

(22) PCT Filed: Dec. 18, 2013

(86) PCT No.: PCT/KR2013/011839
§ 371 (c)(1),
(2) Date: May 20, 2015

(87) PCT Pub. No.: WO2014/098486
PCT Pub. Date: Jun. 26, 2014

(65) Prior Publication Data
US 2015/0299860 A1    Oct. 22, 2015

(30) Foreign Application Priority Data
Dec. 18, 2012    (KR) .................. 10-2012-0148665

(51) Int. Cl.
*F25B 29/00*    (2006.01)
*C23C 16/46*    (2006.01)
(Continued)

(52) U.S. Cl.
CPC .......... *C23C 16/46* (2013.01); *C23C 16/4412* (2013.01); *C23C 16/4585* (2013.01);
(Continued)

(58) Field of Classification Search
CPC . C23C 16/46; C23C 16/4412; C23C 16/4585; C23C 16/463; H01L 21/67103; H01L 21/67109
(Continued)

(56) References Cited
U.S. PATENT DOCUMENTS 8,125,757 B2    2/2012    Morooka
2009/0194018 A1    8/2009    Higashi et al.
(Continued)

FOREIGN PATENT DOCUMENTS

| JP | 2009-170676 A | 7/2009 |
| KR | 10-2001-0027089 A | 4/2001 |
| KR | 10-2007-0014716 A | 2/2007 |

*Primary Examiner* — Travis Ruby
(74) *Attorney, Agent, or Firm* — Rabin & Berdo, P.C.

(57) ABSTRACT

A substrate processing apparatus includes a main chamber having a process space in which a process with respect to a substrate is performed, a heater disposed in the process space to heat the substrate placed on an upper portion thereof, and a cooling ring around the heater, the cooling ring having a plurality of cooling gas passages spaced apart at a predetermined distance around the heater to allow a refrigerant supplied from the outside to selectively flow therein.

8 Claims, 7 Drawing Sheets

(51) Int. Cl.
  *H01L 21/67*   (2006.01)
  *C23C 16/458*   (2006.01)
  *C23C 16/44*   (2006.01)

(52) U.S. Cl.
  CPC ...... *C23C 16/463* (2013.01); *H01L 21/67103* (2013.01); *H01L 21/67109* (2013.01)

(58) Field of Classification Search
  USPC .......................................................... 165/48.1
  See application file for complete search history.

(56) References Cited

U.S. PATENT DOCUMENTS

| | | |
|---|---|---|
| 2010/0002355 A1 | 1/2010 | Morooka |
| 2012/0221138 A1* | 8/2012 | Hong ...................... C23C 16/46 700/108 |

* cited by examiner

SUBSTRATE TREATMENT APPARATUS, AND METHOD FOR CONTROLLING TEMPERATURE OF HEATER

TECHNICAL FIELD

The present invention disclosed herein relates to a substrate processing apparatus, and more particularly, to a substrate processing apparatus in which a heater is locally controlled in temperature to heat a substrate at a uniform temperature, thereby performing processes with respect to the substrate, and a method for adjusting a temperature of the heater.

BACKGROUND ART

In a semiconductor device manufacturing process, it is required to perform a thermal processing process on a substrate at a uniform temperature. Examples of the manufacturing process may include chemical vapor deposition and silicon epitaxial growth processes in which a material layer having a gas phase is deposited on a semiconductor substrate placed on a susceptor within a reactor. The susceptor is generally heated at a temperature of about 400° C. to about 1,250° C. by resistance heating, high-frequency heating, infrared heating, and the like. In this state, a gas chemically reacts while passing through the reactor to cause the deposition in the state of the gas phase at a position that is very close to a surface of the substrate. Due to this reaction, a desired production may be deposited on the substrate.

A semiconductor device includes a plurality of layers on a silicon substrate. The layers are deposited on the substrate through the deposition process. The deposition process has several important issues. The issues are important in evaluating a deposited layer and selecting a deposition method.

First, one of the important issues may be quality of the deposited layer. This represents compositions, contamination levels, defect density, and mechanical and electrical properties of the deposited layer. The deposited layer may be changed in composition according to deposition conditions. This is very important for obtaining a specific composition.

Second, one of the important issues may be a uniform thickness crossing a wafer. Specifically, a layer deposited on a pattern having a nonplanar shape in which a stepped portion is formed is very important in thickness. Whether the deposited layer has a uniform thickness may be determined through a step coverage which is defined as a value obtained by dividing a minimum thickness of a layer deposited on the stepped portion by a thickness of a layer deposited on a top surface of a pattern.

The other issue with respect to the deposition may be a filling space. This includes gap filling in which an insulation layer including an oxide layer is filled between metal lines. The gap is provided for physically and electrically insulating the metal lines from each other. Among the above-described issues, the uniformity may be one of important issues related to the deposition process. A non-uniform layer may cause high electrical resistance on the metal lines to increase possibility of mechanical damage.

DISCLOSURE OF THE INVENTION

Technical Problem

An object of the present invention improves a temperature gradient of a hearer by installing a cooling ring around the heater for heating a substrate.

Further another object of the present invention will become evident with reference to following detailed descriptions and accompanying drawings.

Technical Solution

According to an embodiment of the present invention, a substrate processing apparatus includes: a main chamber having a process space in which a process with respect to a substrate is performed; a heater disposed in the process space to heat the substrate placed on an upper portion thereof; and a cooling ring disposed around the heater, the cooling ring having a plurality of gas passages spaced apart at a predetermined distance around the heater to allow a refrigerant supplied from the outside to selectively flow therein.

The cooling ring may include outlet holes respectively connected to the gas passages and opened to the inside or outside of the cooling ring.

The substrate processing apparatus may further include a guide member that is disposed in the process space and includes gas supply tubes supplying the refrigerant supplied from the outside toward each of the gas passages, wherein the guide member may further include: a bottom plate connected along a bottom surface of the main chamber; a side plate connected to a side portion of the bottom plate; and a support member protruding to the heater and connected to the side plate to support the cooling ring.

The guide member may include a protrusion that stands up on an upper portion of the side plate, and the substrate processing apparatus may further include an exhaust ring having process gas discharge holes connected to an upper portion of the protrusion to discharge a process gas supplied through a showerhead to the outside and refrigerant discharge holes defined at positions corresponding to the outlet holes to discharge the refrigerant to the outside.

The substrate processing apparatus may further include a valve connected to each of the gas supply tubes to open or close the gas supply tube.

The cooling ring may include upper discharge holes defined above the gas passages to discharge a process gas supplied through the showerhead to the outside.

The gas passages may be disposed at an equal angle with respect to a center of the heater.

The cooling ring may be spaced apart from the heater.

According to another embodiment of the present invention, a method for adjusting a temperature of a heater includes: disposing a cooling ring around a heater on which a substrate is placed, wherein the cooling ring includes a plurality of gas passages that are spaced apart from each other around the heater; and determining a high temperature zone of the heater having a temperature greater than a preset temperature according to a temperature distribution in the heater to supply a refrigerant into only the gas passage, which is disposed outside the high temperature zone, among the plurality of gas passages, thereby adjusting the temperature distribution in the heater, wherein the adjusting of the temperature distribution in the heater includes respectively connecting a plurality of gas supply tubes to the gas passages and disposing a plurality of valves in the gas supply tubes to open the valve in the gas passage that is disposed outside the high temperature zone and close the remaining valves.

The adjusting of the temperature distribution in the heater may further include discharging the refrigerant through an outlet hole formed in the inside or outside of the cooling ring and connected to the gas passage, which is disposed outside the high temperature zone, among a plurality of outlet holes connected to the gas passages.

Advantageous Effects

According to the embodiment of the present invention, the cooling ring is installed around the heater to improve the temperature gradient of the heater, thereby improving the quality of the substrate.

BEST MODE FOR CARRYING OUT THE INVENTION

Figure 1:
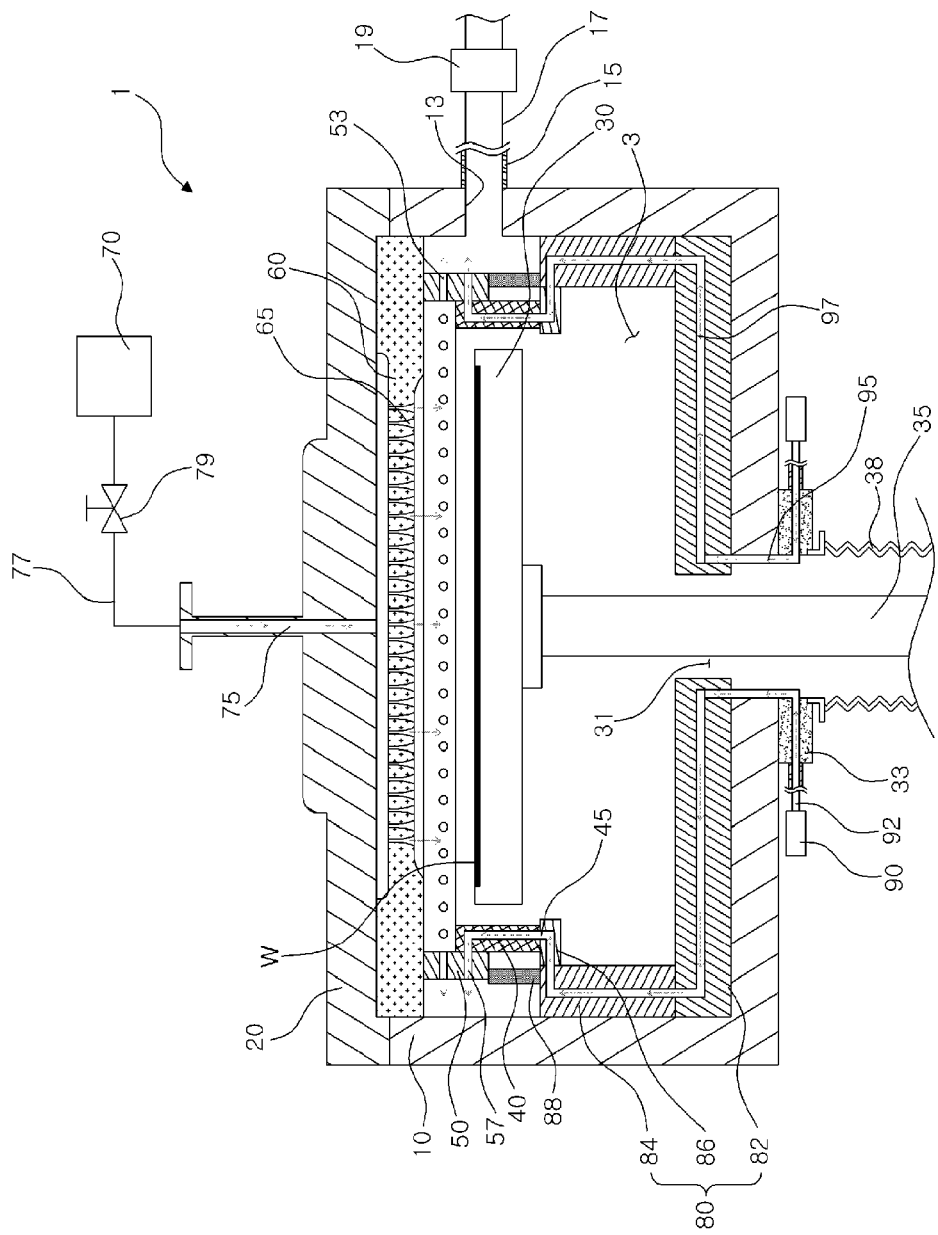
FIG. 1 is a schematic view of a substrate processing apparatus according to an embodiment of the present invention.

Hereinafter, exemplary embodiments of the present invention will be described in more detail with reference to FIGS. 1 to 5. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

FIG. 1 is a schematic view of a substrate processing apparatus according to an embodiment of the present invention. Referring to FIG. 1, a substrate processing apparatus 1 includes a main chamber 10 and a chamber cover 20. The main chamber 10 has an opened upper portion. A passage (not shown) through which a substrate W is accessible may be defined in one side of the main chamber 10. The substrate W may be accessible into the main chamber 10 through the passage defined in the one side of the main chamber 10. A gate valve (not shown) is disposed outside the passage. Thus, the passage may be opened or closed by the gate valve.

The chamber cover 20 is connected to the opened upper portion of the main chamber 10 to block the inside of the main chamber 10 from the outside, thereby forming a process space 3 in the main chamber 10. A sealing member (not shown) may be disposed between the main chamber 10 and the chamber cover 20 to completely seal the process space 3. A gas supply hole 75 passes through a ceiling wall of the chamber cover 20. Also, a process gas is supplied into the main chamber 10 through a process gas supply tube 77. The process gas supply tube 77 is connected to a process gas storage tank 70 to open or close a valve 79, thereby adjusting an injection amount of process gas.

A showerhead 60 having a plurality of diffusion holes 65 is disposed on a lower end surface of the chamber cover 20. The showerhead 60 may uniformly supply the process gas onto the substrate W through the plurality of diffusion holes 65 defined at the same height. The process gas may include hydrogen ($H_2$), nitrogen ($N_2$), or a predetermined inert gas. In addition, the process gas may include a precursor gas such as silane ($SiH_4$) or dichlorosilane ($SiH_2Cl_2$). Also, the process gas may include a dopant gas such as diborane ($B_2H_6$) or phosphine ($PH_3$). The showerhead 60 diffuses the process gas supplied through the gas supply hole 75 onto the substrate W so that the process flows onto the substrate W. The process gas supplied through the showerhead 60 may move into an exhaust space after a predetermined process is completed, and then be exhausted through an exhaust passage 13 defined in the other side of the main chamber 10 to communicate with the exhaust space.

A heater 30 is disposed in the process space 3 of the substrate processing apparatus 1. The heater 30 receives current from an external power source (not shown) to generate heat. A seat groove (not shown) on which the substrate W is loaded and seated may be defined in a top surface of the heater 30. The heater 30 has a circular disk shape corresponding to that of the substrate W to uniformly heat the substrate W. Also, the heater 30 may have an area greater than that of the substrate W. A through hole 31 is defined in a central lower portion of the heater. A support shaft 35 is connected to a lower portion of the heater 30 to support the heater 30. The support shaft 35 may be connected to a driving unit (not shown) to rotate together with the heater 30.

Also, the substrate processing apparatus 1 may further include a bellows 38 in an inner space 3 thereof to maintain an internal atmosphere to a vacuum state and block an external atmosphere of the substrate processing apparatus 1 while the substrate W is processed. The bellows 38 may be connected to a side of a lower portion of an upper fixing member 33 disposed in a through hole 31 of the main chamber 10. The bellows 38 may be compressible and extendable and has an annular shape. Also, the bellows 38 is disposed between the upper fixing member 33 and a lower fixing member (not shown) in a state where the bellows 38 surrounds a support shaft 35.

A guide member 80 is disposed along a bottom surface and a side surface of the main chamber 10. The guide member 80 includes a bottom plate 82 disposed on a bottom surface of the main chamber 10, a side plate 84 having a cylindrical shape and disposed along a side surface of the main chamber 10, a support member 86 connected along an inner circumferential surface of the side plate 84 to protrude to the heater 30. A plurality of gas supply tubes 97 are disposed in an inner surface of the guide member 80. The gas supply tubes 97 are connected to connection tubes 95, respectively. The connection tubes 95 may pass through the upper fixing member 33 and inserted into the upper fixing member 33. The connection tubes 95 pass through the upper fixing member 33 to communicate with the gas supply tubes 97 disposed in the bottom plate 82 along a sidewall of the through hole 31. That is, a refrigerant passes through a gas passage 45 of a cooling ring 40 (that will be described later) from a refrigerant storage tank 90 through the connection tubes 95 and the gas supply tubes 97 which are connected to each other.

Recently, as the substrate W is large-scaled in size, the heater 30 also increases in size. Thus, it may be difficult to form uniform temperature distribution on the substrate W. That is, while the substrate W is heated at a preset process temperature, the heater may be broken down or deteriorated in performance. In addition, radiant heat of the heater W may be locally unbalanced. Thus, to solve these problems, the cooling ring 40 may be disposed around the heater W to minimize a temperature change of the substrate W, which occurs due to the local temperature change of the heater W. The cooling ring 40 is disposed on an upper end of the support member 86. The cooling ring 40 may be disposed spaced a predetermined distance from the circumference of the heater W. Preferably, the cooling ring 40 may be spaced apart from the heater 30 by a distance of about 10 mm. Also, the cooling ring 40 may be formed of a refractory material that is well endurable against a high temperature of the heater W. Also, the cooling ring 40 may be coated with $Al_2O_3$ and $Y_2O_3$ to reduce a thermal expansion coefficient and increase a heat conduction coefficient.

The cooling ring 40 has a plurality of gas passages 45. Here, the plurality of gas passages 45 are connected to the corresponding gas supply tubes 97, respectively. The gas passages 45 communicate with the gas supply tubes 97 through inlet holes (see reference numeral 43 of FIG. 2) to introduce the refrigerant toward the gas passages 45. Then, the refrigerant is discharged through outlet holes (see reference numeral 47 of FIG. 2). A connection member 88 stands up on an upper portion of the side plate 84, and an exhaust ring 50 is connected to an upper end of the connection member 88. Preferably, a side lower end of the showerhead 60 and the upper end of the connection member 88 are connected to each other and spaced apart from the sidewall of the main chamber 10 to partition the inside of the main chamber 10 into the inner exhaust space and an outer process space 3.

The exhaust ring 50 has process gas discharge holes 53 and refrigerant discharge holes 57, which are respectively defined in upper and lower portions thereof at a preset distance. The process gas dispersed through the showerhead 60 is discharged into an exhaust port through the process gas discharge holes 53 after a predetermined process is performed on the substrate W. The refrigerant supplied into the gas passages 45 of the cooling ring 40 is discharged into the exhaust port 15 through the refrigerant discharge holes 57 defined in positions corresponding to the outlet holes (see reference numeral 47 of FIG. 2). An exhaust line 17 is connected to the exhaust port 15. Thus, non-reaction gases or byproducts discharged through the process gas discharge holes and refrigerant gases discharged through the refrigerant discharge holes 57 are discharged through the exhaust line 17. The gases may be forcibly discharged to the outside through an exhaust pump 19 connected to the exhaust line 17.

Figure 2:
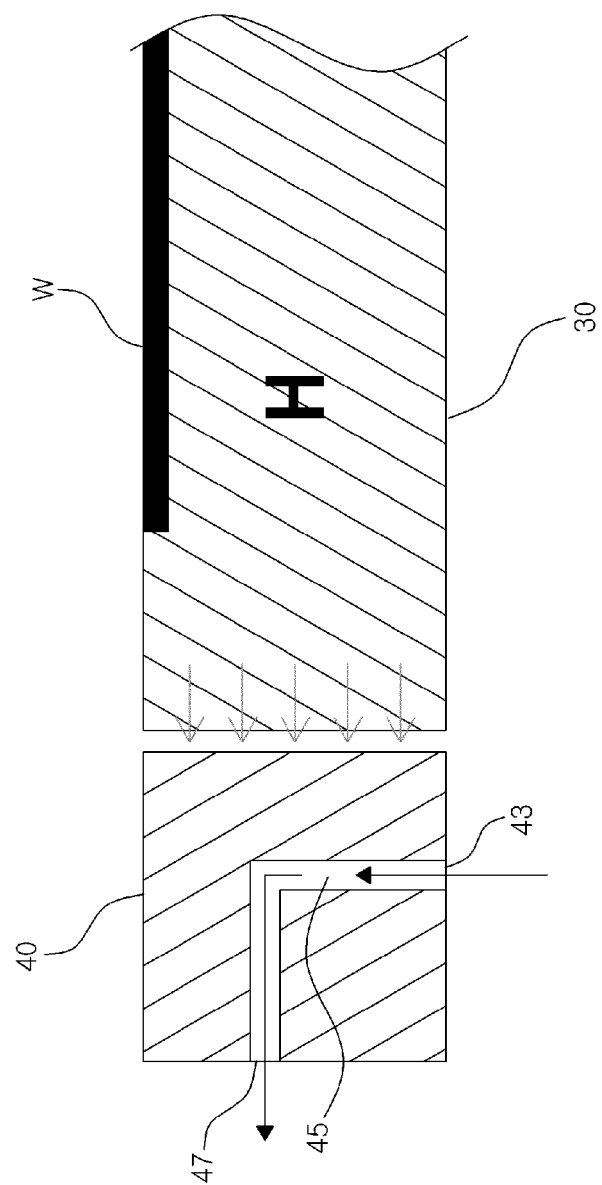
FIG. 2 is a view illustrating a heat-exchanging state of a heater due to a refrigerant flow through a cooling ring of FIG. 1.

FIG. 2 is a view illustrating a heat-exchanging state of a heater due to a refrigerant flow through a cooling ring of FIG. 1. As described above, the cooling ring 40 has the plurality of gas passages 45. Referring to FIG. 2, the gas passages 45 respectively communicate with the gas supply tubes 97 to receive the refrigerant. Each of the gas passages 45 has the inlet hole 43 and the outlet hole 47. The refrigerant supplied through the inlet hole 43 passes through each of the gas passages 45 and then is discharged into the outlet hole 47. Thus, a preset region of the heater 30 into which the refrigerant is supplied may decrease in temperature. That is, the local temperature deviation of the heater 30 may be prevented to result in uniform temperature gradient over an entire region of the heater 30 by supplying the refrigerant through the gas passages 45.

Figure 3:
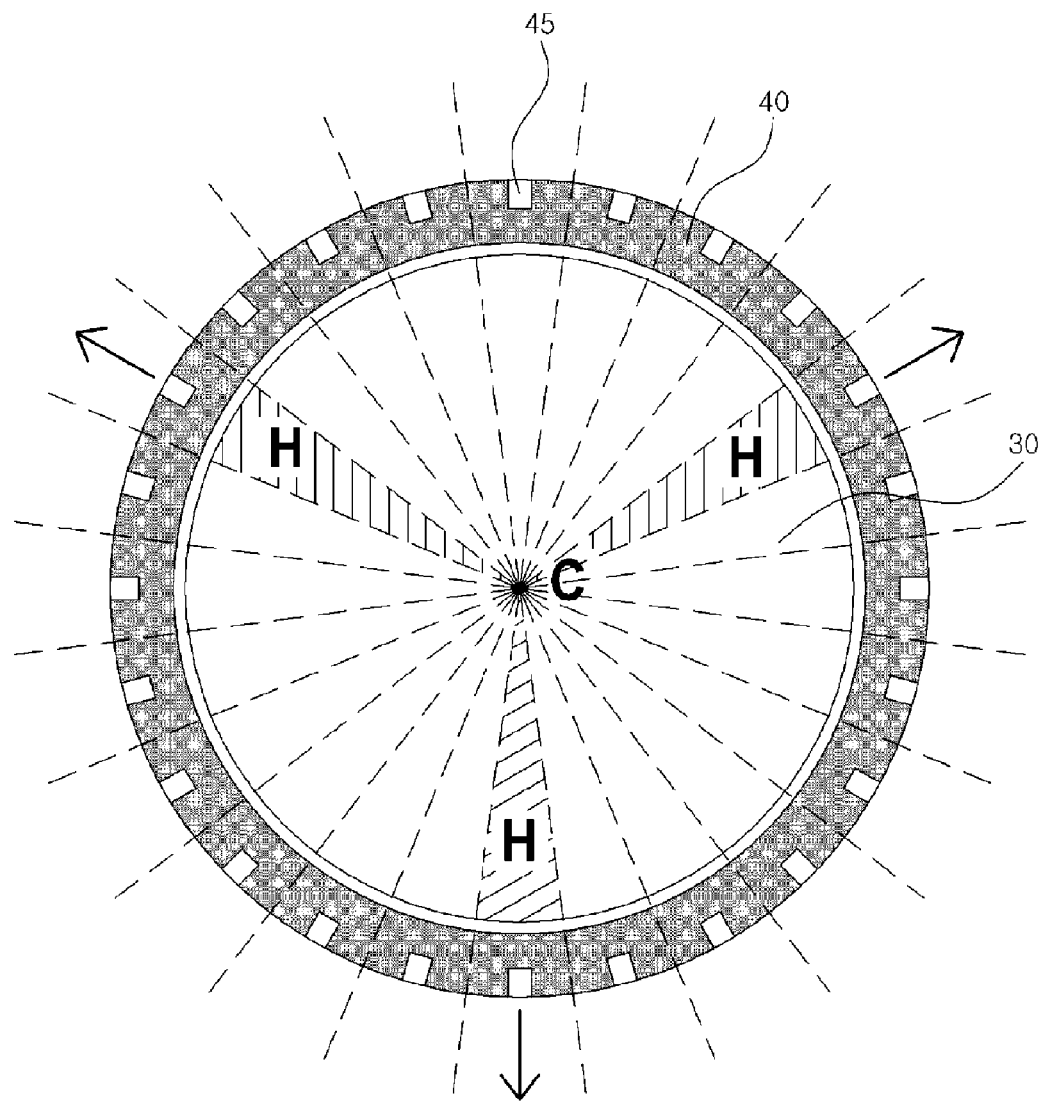
FIG. 3 is a view illustrating an arrangement of gas passages defined in the cooling ring of FIG. 1.

FIG. 3 is a view illustrating an arrangement of the gas passages 45 defined in the cooling ring of FIG. 1. As illustrated in FIG. 3, the cooling ring 40 has the plurality of gas passages 45. The gas passages 45 are disposed at an equal angle with respect to a center C of the heater 30, and each of the gas passages 45 may have a diameter of about 0.5 mm to about 5 mm. Although the cooling ring 40 having twenty-four gas passages 45 are exemplified in the current embodiment, the number of gas passages 45 may increase or decrease according to a preset distance therebetween.

For example, if the cooling ring 40 having the twenty-four gas passages 45 is provided, the heater 30 may also be partitioned into twenty-four zones. Among the zones, if a valve (not shown) connected to the gas passage 45 that corresponds to a zone H having a relatively high temperature is opened to allow the refrigerant to flow, a portion corresponding to the zone H of the cooling ring 40 may be cooled. Thus, the zone H may be indirectly cooled to uniformly adjust a temperature for each zone.

Figure 4:
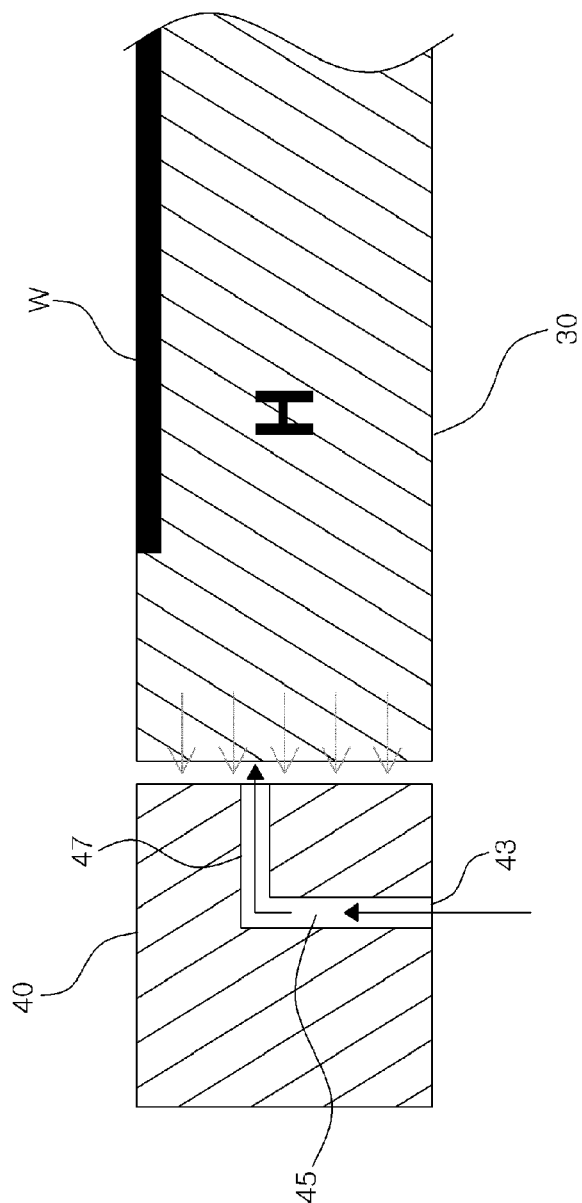
FIG. 4 is a view of a cooling ring of FIG. 2 according to another embodiment of the present invention.

Although the refrigerant flowing into the gas passages 45 is discharged to the outside of the cooling ring 40 through the outlet hole 47 in the current embodiment, the present invention is not limited thereto. For example, as illustrated in FIG. 4, the refrigerant may be discharged to the inside of the cooling ring 40 and then directly injected into the heater 30. Here, the outlet hole 47 may be opened toward the inside of the cooling ring 40. The heater 30 may be directly cooled through the refrigerant injected from the cooling ring 40.

Figure 5:
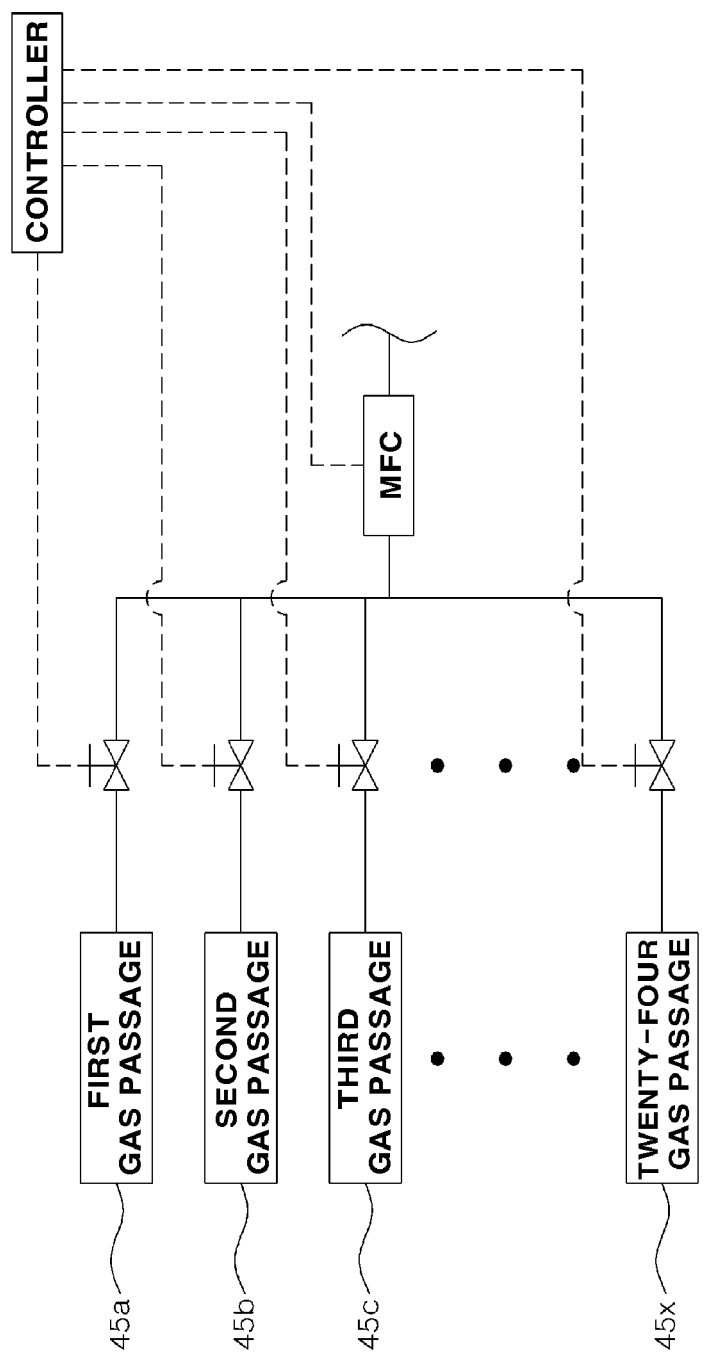
FIG. 5 is a view of a connection state between a gas passage and a gas supply tube which are illustrated in FIG. 1.

FIG. 5 is a view of a connection state between the gas passages 45 and the gas supply tubes 97 which are illustrated in FIG. 1. As described above, the gas passages 45 are connected to the gas supply tubes 97, respectively. A first gas passage is connected to a first gas supply tube, and a second gas passage is connected to a second gas supply tube. A valve for controlling the supply of the refrigerant is disposed in each of the gas supply tubes 97. The valve may adjust an opened degree of the gas supply tube 97 or a flow amount of the refrigerant to control the supply of the refrigerant into the gas passages 45. Thus, the refrigerant may be supplied into the gas passages 45 to minimize the local temperature difference in the heater 30. In this state, the substrate W may be heated to improve process uniformity of the substrate W. Each of the plurality of valves and a mass flow meter (MFC) is connected to a controller. The controller may measure a temperature distribution in the heater 30 through a thermocouple disposed in the heater 30 and then feedback-controls the refrigerant through the plurality of valves and the MFC as described above to minimize the temperature deviation of the heater 30.

Although the present invention is described in detail with reference to the exemplary embodiments, the invention may be embodied in many different forms. Thus, technical idea and scope of claims set forth below are not limited to the preferred embodiments.

Mode for Carrying out the Invention

Hereinafter, exemplary embodiments of the present invention will be described in detail with reference to FIGS. 6 to 7. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

Figure 6:
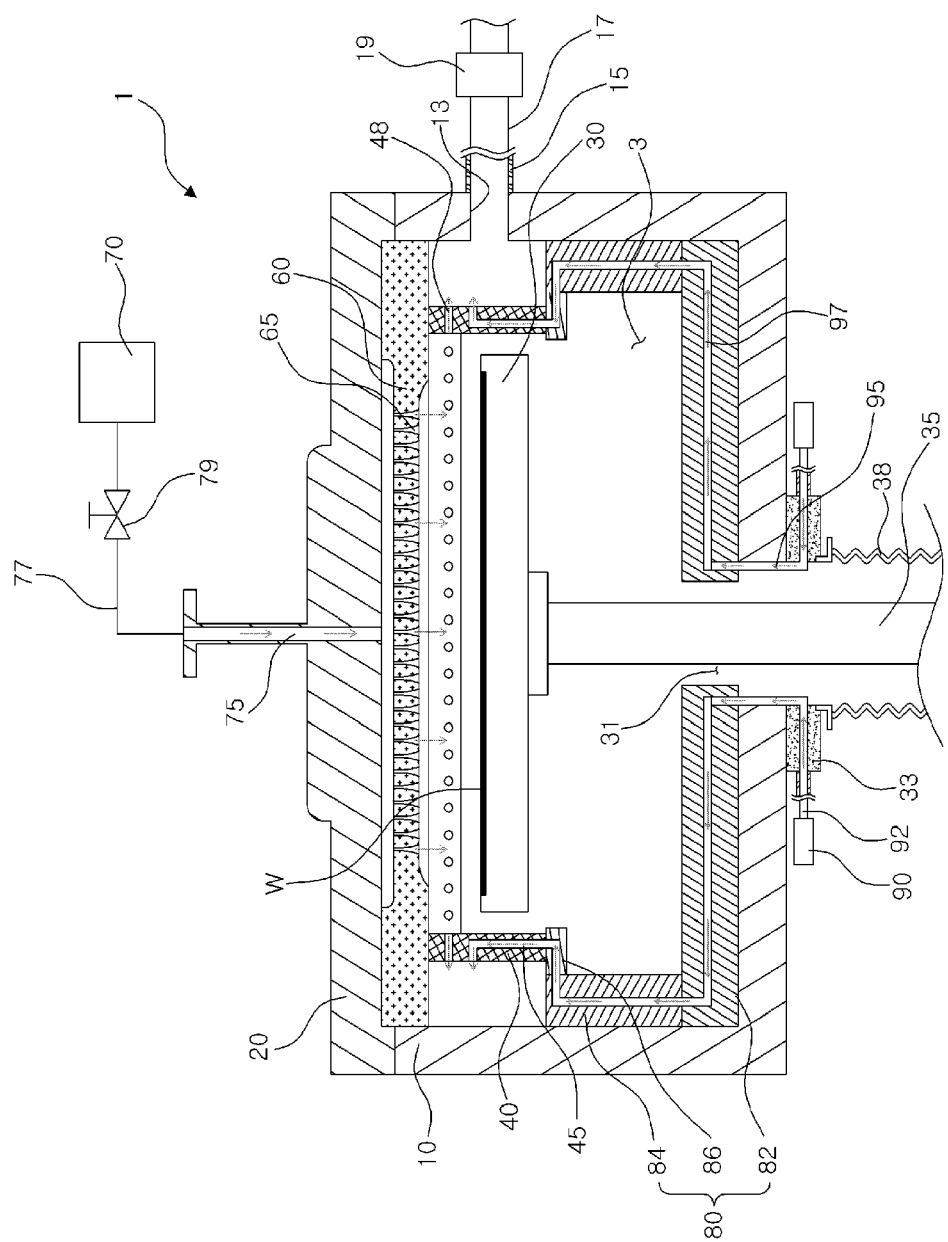
FIG. 6 is a schematic view of a substrate processing apparatus according to another embodiment of the present invention.

FIG. 6 is a schematic view of a substrate processing apparatus according to another embodiment of the present invention. The substantially same components as those described with reference to FIGS. 1 to 5 are given to the same reference numbers, and thus their detailed descriptions may be replaced by those of the foregoing embodiments. For convenience of description, different points from those of the substrate processing apparatus 1 of FIG. 1 will be mainly described below.

As illustrated in FIG. 6, a cooling ring 40 may be disposed between a support member 86 and a showerhead 60 to isolate a process space 3. A plurality of gas passages 45 are defined in a bottom surface of the cooling ring 40 at a preset distance, and a plurality of upper discharge holes 48 are defined in an upper surface of the cooling ring 40. The gas passages 45 defined in the cooling ring 40 communicate with refrigerant supply tubes 97 to receive a refrigerant. Since the refrigerant is supplied through the gas passages 45, a local temperature deviation in a heater 30 may be controllable. Byproducts and non-reaction gases which are generated after a process may be discharged to the outside through the upper discharge holes 48 defined in the top surface of the cooling ring 40 and an exhaust port 15. That is, unlike FIG. 1, temperature uniformity of the heater 30 and discharge of the process gas may be enabled through the cooling ring 40 in itself without providing a separate exhaust ring. Thus, a local temperature difference in the heater 30 may be minimized through the refrigerant supplied into the gas passages 45. In this state, the substrate W may be heated to improve quality of the substrate W.

Figure 7:
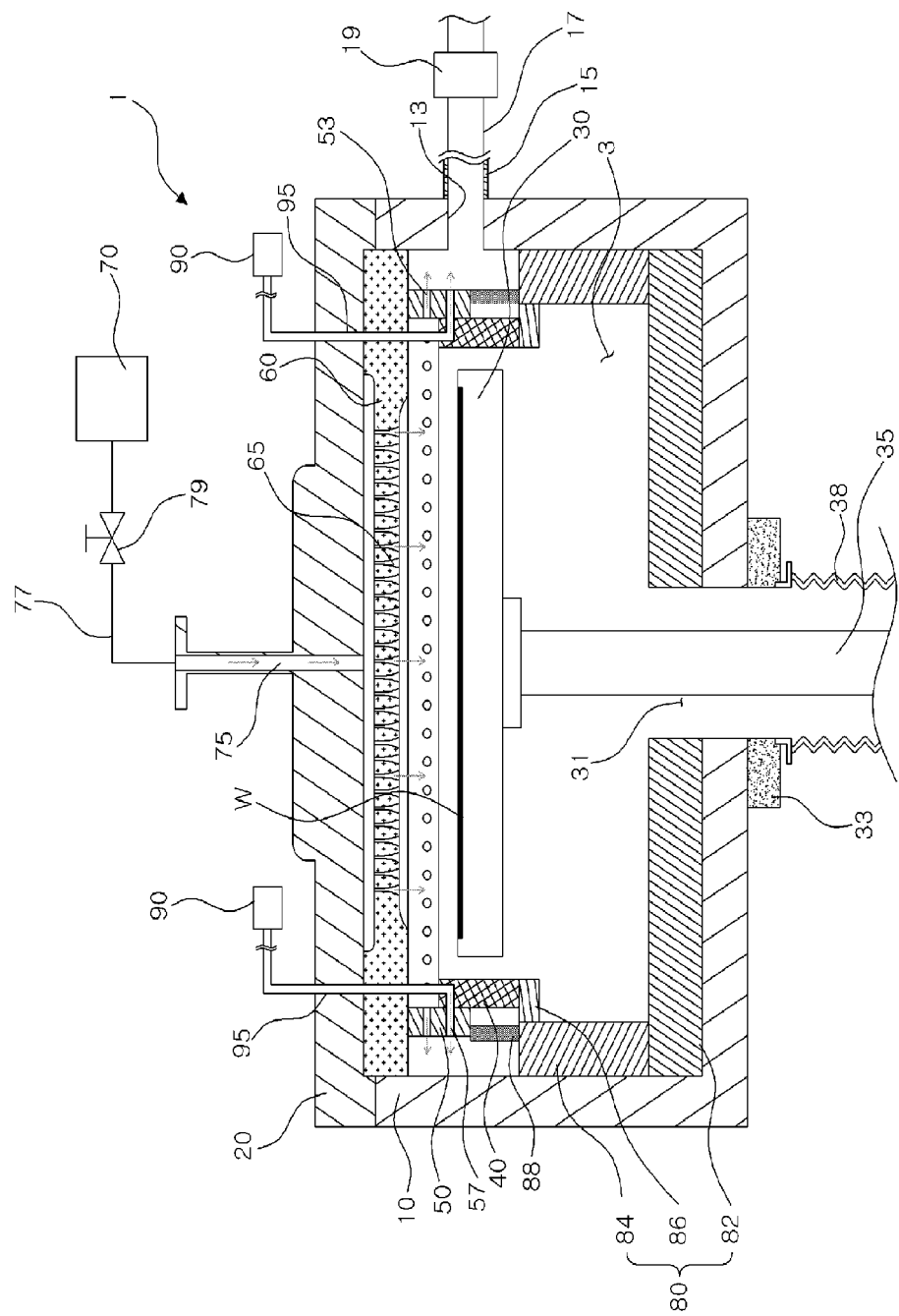
FIG. 7 is a schematic view of a substrate processing apparatus according to further another embodiment of the present invention.

FIG. 7 is a schematic view of a substrate processing apparatus according to further another embodiment of the present invention. As illustrated in FIG. 7, a connection tube 95 may pass through a flange unit of a showerhead 60 and a chamber cover 20. The connection tube 95 may be connected to a refrigerant storage tank 90.

As described above, since the cooling ring 40 is disposed around the heater 30, and the refrigerant is selectively supplied into the cooling ring 40 according to a position of the cooling ring 40, a portion of the cooling ring 40 may be cooled. Therefore, a portion of the heater 30 may be cooled to control temperature non-uniformity in the heater 30. Particularly, the refrigerant may be an inner gas. Since the inert gas does not have a direct effect on the process, the temperature non-uniformity in the heater 30 may be controlled during the process to improve process uniformity.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to various semiconductor manufacturing facilities and methods.

What is claimed is:

1. A substrate processing apparatus comprising:
a main chamber having a process space in which a process with respect to a substrate is performed;
a heater disposed in the process space to heat the substrate placed on an upper portion thereof;
a cooling ring disposed around the heater, the cooling ring having
a plurality of cooling gas passages spaced apart at a predetermined distance around the heater, and
outlet holes respectively connected to the cooling gas passages and opened toward the heater or toward a side wall of the main chamber to allow a refrigerant to flow out therethrough;
a guide member disposed in the process space and including cooling gas supply tubes through which the refrigerant is supplied from the outside of the main chamber to each of the cooling gas passages; and
a valve connected to each of the cooling gas supply tubes to open or close said each of the cooling gas supply tubes.

2. The substrate processing apparatus of claim 1, wherein the guide member further comprises:
a bottom plate connected along a bottom surface of the main chamber;
a side plate connected to a side portion of the bottom plate; and
a support member protruding to the heater and connected to the side plate to support the cooling ring.

3. The substrate processing apparatus of claim 2, wherein the guide member comprises a protrusion that stands up on an upper portion of the side plate, and
the substrate processing apparatus further comprises an exhaust ring having process gas discharge holes connected to an upper portion of the protrusion to discharge a process gas supplied through a showerhead to the outside and refrigerant discharge holes defined at positions corresponding to the outlet holes to discharge the refrigerant to the outside.

4. The substrate processing apparatus of claim 2, wherein the cooling ring comprises upper discharge holes defined above the cooling gas passages to discharge a process gas supplied through the showerhead to the outside.

5. The substrate processing apparatus of claim 1, wherein the cooling gas passages are disposed at an equal angle with respect to a center of the heater.

6. The substrate processing apparatus of claim 1, wherein the cooling ring is spaced apart from the heater.

7. A method for adjusting a temperature of a substrate processing apparatus, the substrate processing apparatus comprising:
a main chamber having a process space in which a process with respect to a substrate is performed,
a heater disposed in the process space to heat the substrate placed on an upper portion thereof,
a cooling ring surrounding the heater from an outside of the heater, the cooling ring having
a plurality of cooling gas passages spaced apart at a predetermined distance around the heater, and
outlet holes respectively connected to the cooling gas passages and opened toward the heater or toward a side wall of the main chamber to allow a refrigerant to flow out therethrough,
a guide member disposed in the process space and including cooling gas supply tubes through which the refrigerant is supplied from the outside to each of the cooling gas passages, and
a valve connected to each of the cooling gas supply tubes to open or close said each of the cooling gas supply tubes,
the method comprising:
determining a high temperature zone of the heater having a temperature greater than a preset temperature according to a temperature distribution in the heater, and
adjusting the temperature distribution in the heater by supplying the refrigerant through corresponding cooling gas passages to the high temperature zone with closing remaining cooling gas passages.

8. The method of claim 7, wherein the adjusting the temperature distribution in the heater further comprises discharging the refrigerant toward the heater through the outlet holes opened toward the heater, or toward the side wall of the main chamber through the outlet hole opened toward the side wall of the main chamber.

\* \* \* \* \*